US009218901B2

(12) United States Patent
Ignatiev et al.

(10) Patent No.: US 9,218,901 B2
(45) Date of Patent: Dec. 22, 2015

(54) TWO TERMINAL MULTI-LAYER THIN FILM RESISTANCE SWITCHING DEVICE WITH A DIFFUSION BARRIER AND METHODS THEREOF

(75) Inventors: Alex Ignatiev, Houston, TX (US); Naijuan Wu, Houston, TX (US); Kristina Young-Fisher, Houston, TX (US); Rabi Ebrahim, Houston, TX (US)

(73) Assignee: Board of Regents, University of Houston, Houston, TX (US)

( * ) Notice: Subject to any disclaimer, the term of this patent is extended or adjusted under 35 U.S.C. 154(b) by 0 days.

(21) Appl. No.: 13/373,808

(22) Filed: Dec. 1, 2011

(65) Prior Publication Data

US 2012/0126195 A1    May 24, 2012

Related U.S. Application Data

(63) Continuation-in-part of application No. 12/586,147, filed on Sep. 17, 2009, now Pat. No. 8,089,111, and application No. 11/034,695, Jan. 13, 2005, now Pat. No. 7,608,467.

(60) Provisional application No. 60/536,155, filed on Jan. 13, 2004.

(51) Int. Cl.
*H01L 21/02* (2006.01)
*H01L 21/00* (2006.01)
(Continued)

(52) U.S. Cl.
CPC ............ *H01C 7/006* (2013.01); *G11C 13/0007* (2013.01); *G11C 13/0069* (2013.01); *H01L 45/08* (2013.01); *H01L 45/085* (2013.01); *H01L 45/12* (2013.01); *H01L 45/1233* (2013.01); *H01L 45/143* (2013.01);
(Continued)

(58) Field of Classification Search
CPC ................................. H01L 45/04; H01C 7/006
USPC .............. 438/3, 261, 287, 785; 257/295, 617, 257/E21.208, E21.436
See application file for complete search history.

(56) References Cited

U.S. PATENT DOCUMENTS 5,274,249 A    12/1993    Xi et al.
5,527,567 A     6/1996    Desu et al.
(Continued)

OTHER PUBLICATIONS

"Growth, Transport, and Magnetic Properties of Pr0.67 Ca0.33MnO3 Thin Films," S.K. Singh, et al., Appl. Phys. Lett., vol. 69, pp. 263-265, 1996.
(Continued)

*Primary Examiner* — Calvin Lee
(74) *Attorney, Agent, or Firm* — Jennifer S. Sickler; Thompson & Knight LLP

(57) ABSTRACT

An electric-pulse-induced-resistance change device (EPIR device) is provided which is a resistance switching device. It has a buffer layer inserted between a first active resistance switching layer and a second active resistance switching layer, with both active switching layers connected to electrode layers directly or through additional buffer layers between the active resistance switching layers and the electrodes. This device in its simplest form has the structure: electrode-active layer-buffer layer-active layer-electrode. The second active resistance switching layer may, in the alternative, be an ion donating layer, such that the structure becomes: electrode-active layer-buffer layer-ion donating layer-electrode. The EPIR device is constructed to mitigate the retention challenge.

7 Claims, 13 Drawing Sheets

(51) Int. Cl.
 *H01C 7/00* (2006.01)
 *G11C 13/00* (2006.01)
 *H01L 45/00* (2006.01)

(52) U.S. Cl.
 CPC ..... *H01L 45/147* (2013.01); *G11C 2013/0073* (2013.01); *G11C 2213/31* (2013.01); *G11C 2213/51* (2013.01); *G11C 2213/56* (2013.01)

(56) References Cited

U.S. PATENT DOCUMENTS

| | | | |
|---|---|---|---|
| 5,887,116 A * | 3/1999 | Grote | 385/2 |
| 6,204,139 B1 | 3/2001 | Liu et al. | |
| 6,653,703 B2 | 11/2003 | Hosotani et al. | |
| 6,661,942 B1 * | 12/2003 | Gharavi | 385/122 |
| 7,029,924 B2 | 4/2006 | Hsu et al. | |
| 7,326,979 B2 | 2/2008 | Rinerson et al. | |
| 7,608,467 B2 * | 10/2009 | Wu et al. | 438/3 |
| 8,089,111 B2 * | 1/2012 | Wu et al. | 257/295 |

OTHER PUBLICATIONS

"Electric-pulse-induced Reversible Reisistance Change Effect in Magnetoresistive Films," S.Q. Liu, et al., Appl. Phys. Lett., vol. 76, pp. 2749-2751, 2000.
Non-final Rejection dated Dec. 31, 2008 for U.S. Appl. No. 11/034,695.
Non-final Rejection dated Nov. 20, 2007 for U.S. Appl. No. 11/034,695.
Non-final Rejection dated Feb. 22, 2007 for U.S. Appl. No. 11/034,695.
Non-final Rejection dated Aug. 12, 2010 for U.S. Appl. No. 12/586,143.
Non-final Rejection dated Feb. 22, 2011 for U.S. Appl. No. 12/586,147.

* cited by examiner

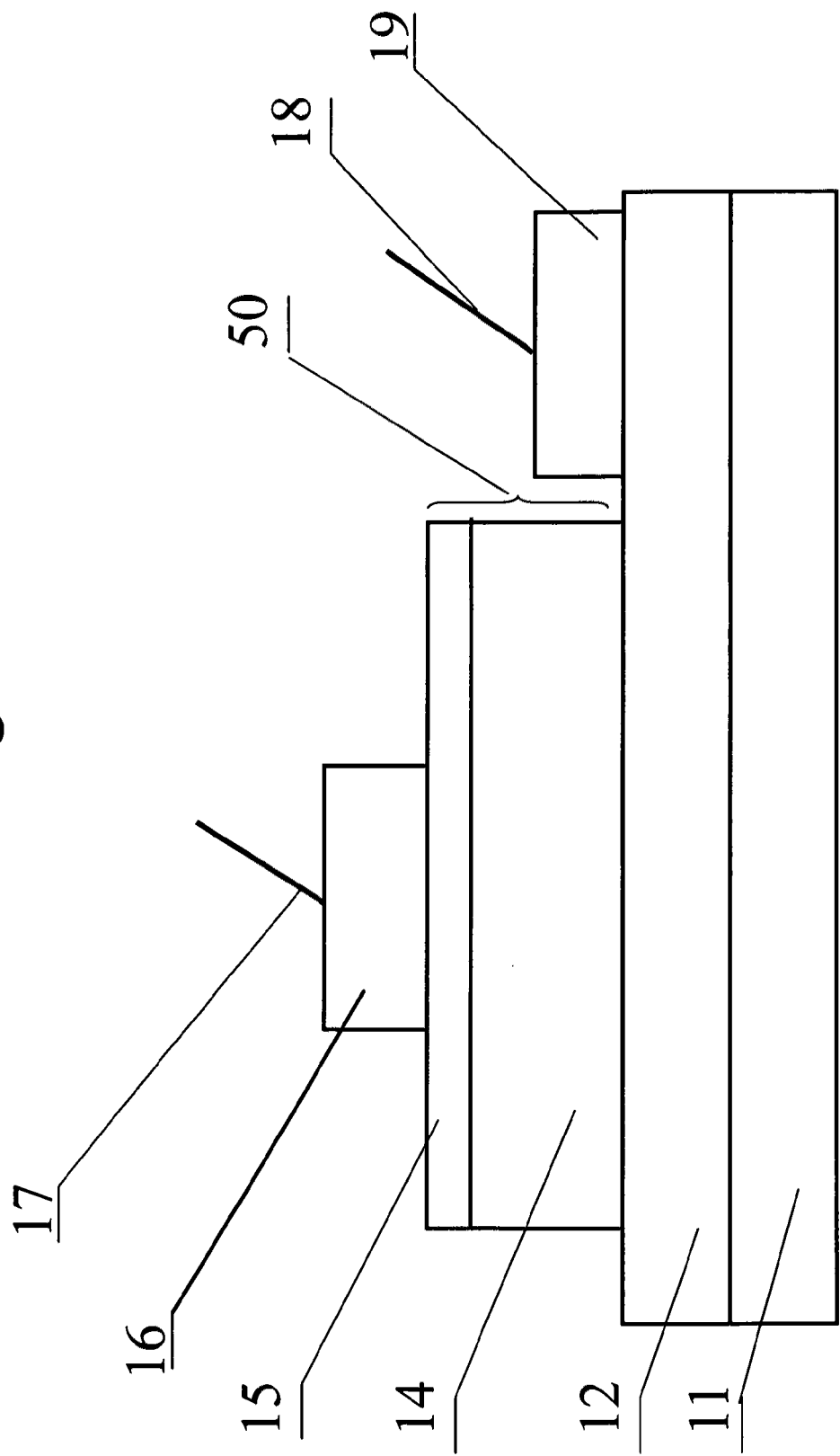

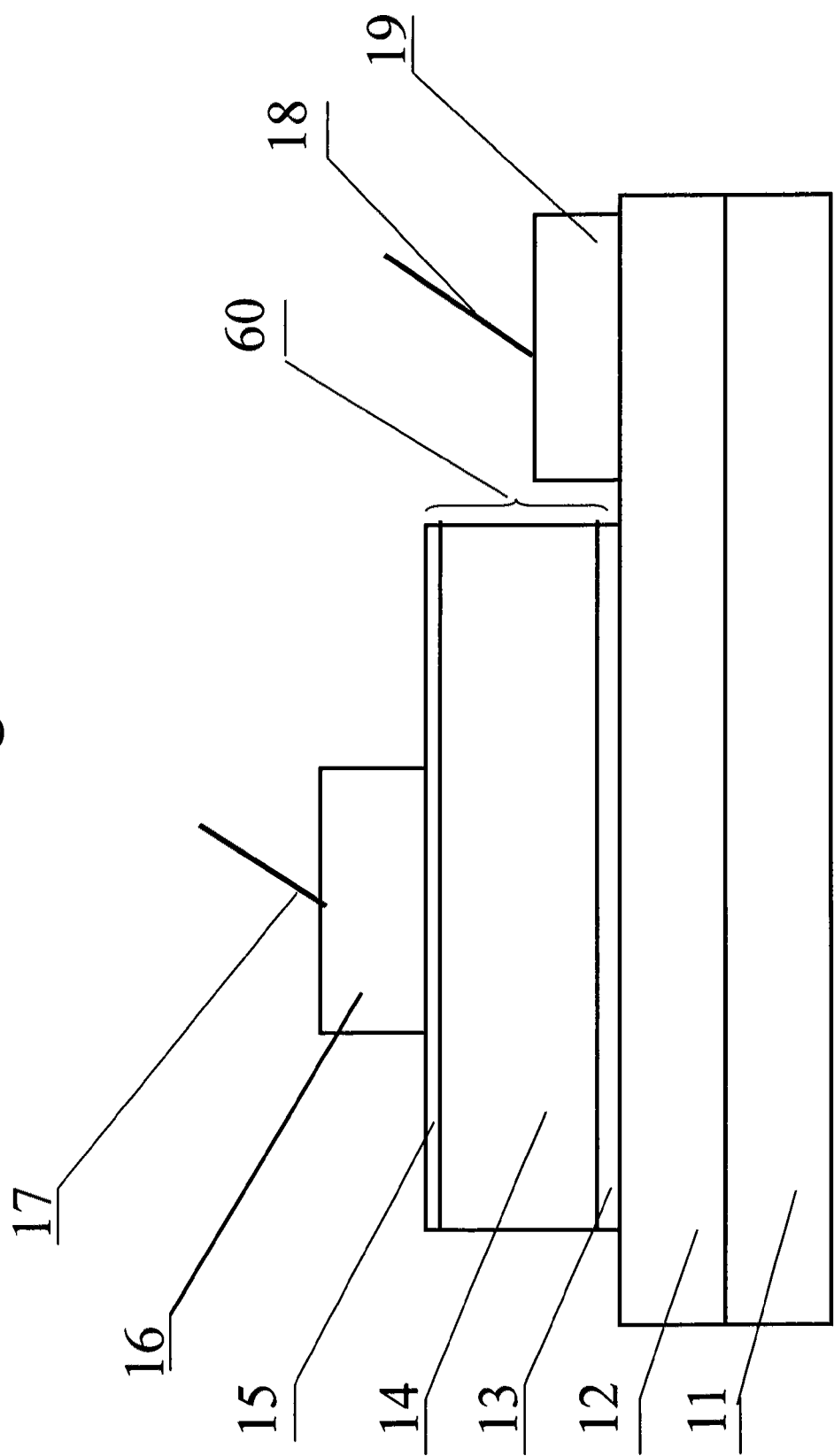

Fig. 2
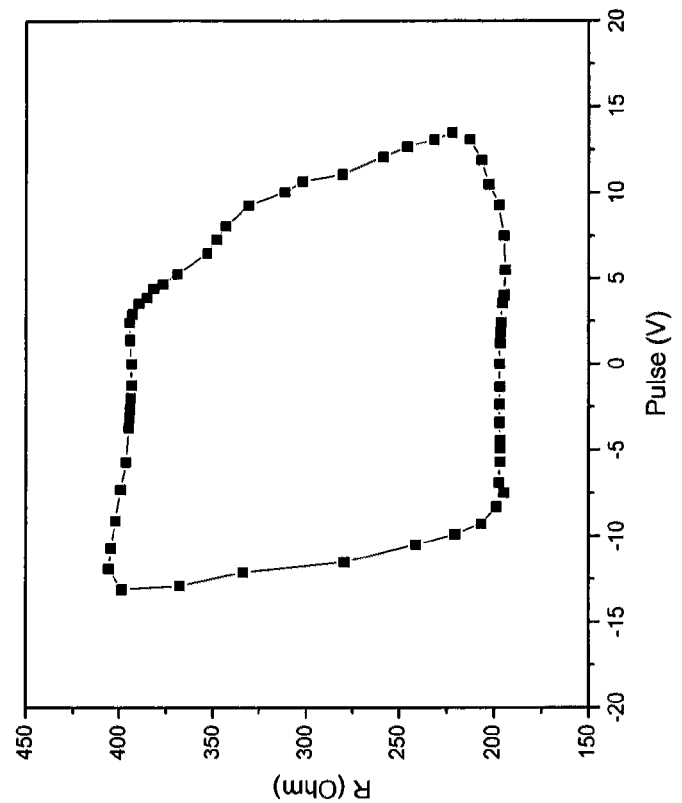
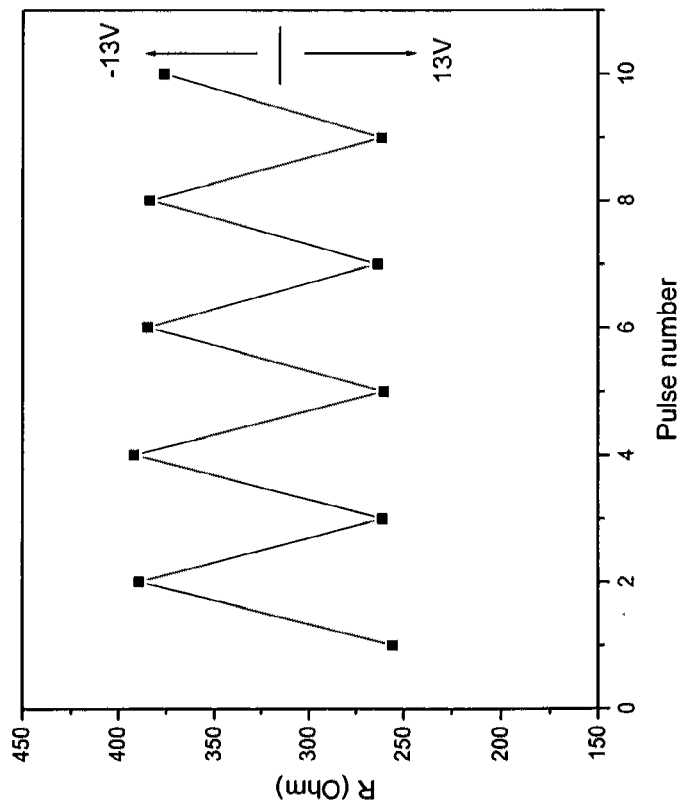

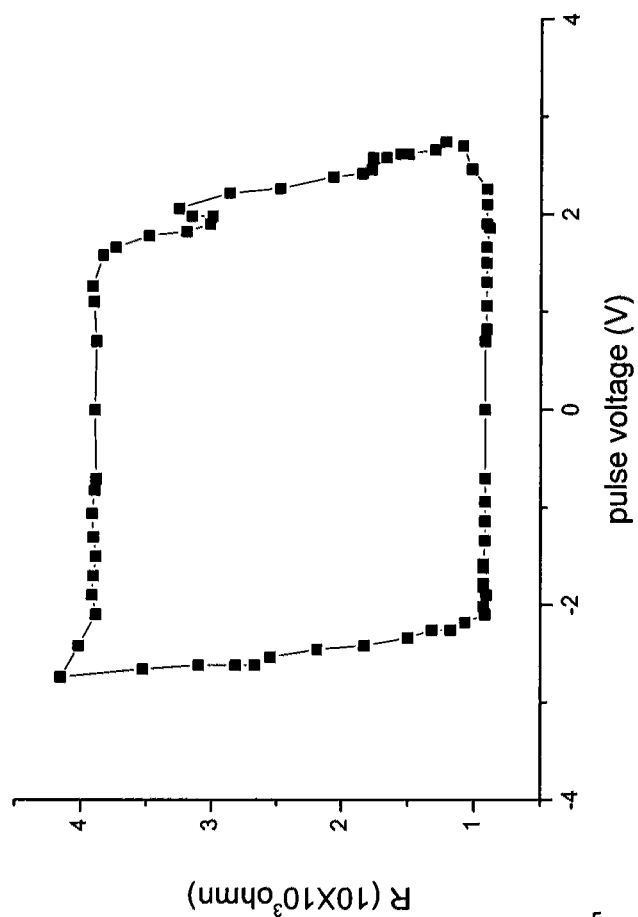
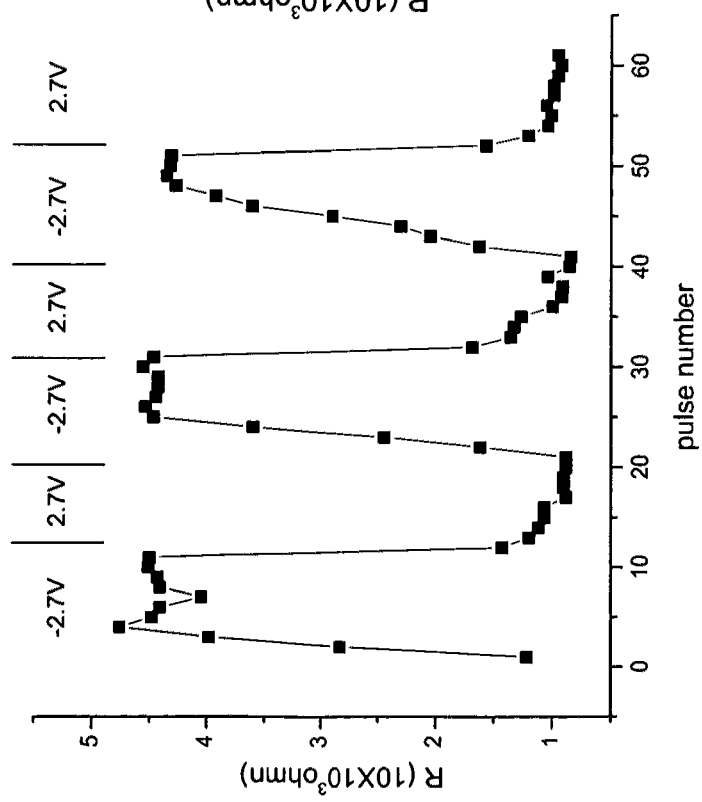
Fig. 5

TWO TERMINAL MULTI-LAYER THIN FILM RESISTANCE SWITCHING DEVICE WITH A DIFFUSION BARRIER AND METHODS THEREOF

CROSS-REFERENCE TO RELATED APPLICATIONS

This application is a continuation in part of U.S. patent application Ser. No. 12/586,147, filed Sep. 17, 2009, now U.S. Pat. No. 8,089,111 issued Jan. 3, 2012, which is a divisional of U.S. patent application Ser. No. 11/034,695, filed on Jan. 13, 2005, now U.S. Pat. No. 7,608,467, issued Oct. 27, 2009, which claims the benefit of U.S. Provisional Application No. 60/536,155, filed on Jan. 13, 2004.

STATEMENT REGARDING FEDERALLY SPONSORED RESEARCH OR DEVELOPMENT

Not Applicable.

REFERENCE TO A "SEQUENTIAL LISTING," A TABLE, OR A COMPUTER PROGRAM LISTING APPENDIX SUBMITTED ON A COMPACT DISC

Not Applicable.

BACKGROUND OF THE INVENTION

1. Field of the Invention

The present invention relates to a two-terminal microelectronic device, and, in particular, to a two-terminal non-volatile resistor device, having a structure of electrode/active-resistance change material-layer/electrode, which is an Electric-Pulse-Induced-Resistance change device, commonly referred to by the acronym EPIR.

2. Description of the Related Art

The electric resistance of transition metal oxides and solid state electrolyte materials can be modified by applying one or more short electrical pulses to a thin film or bulk material. The electric field strength or electric current density of the pulse is sufficient to switch the physical state of the materials so as to modify the properties of the material. The pulse is desired to have low energy so as not to destroy the material. (S. Q. Liu, N. J. Wu, and A. Ignatiev, Applied Physics Letters, 76, 2749 (2000).) Multiple pulses may be applied to the material to produce incremental changes in properties of the material (S. Q. Liu, N. J. Wu, and A. Ignatiev, as disclosed in U.S. Pat. Nos. 6,204,139, and 6,473,332, which are incorporated herein by this reference). One of the properties that can be changed is the resistance of the material. The change may be partially or totally reversible using pulses of opposite polarities. This has been defined as the electrical pulse induced non-volatile resistance change effect, abbreviated as the EPIR effect. Based on the EPIR effect, a two terminal non-volatile resistor device, having a structure of electrode/active-material-layer/electrode, can be produced, and is called an EPIR device.

As an example, it has been shown in the paper "Evidence for an Oxygen Diffusion Model for the Electric Pulse Induced Resistance Change Effect in Transition-Metal Oxides" by Nian et al., Physical Review Letters, The American Physical Society, PRL 98, 146403-1 to 146403-4 (2007), that for an electrode-perovskite oxide-electrode device under applied voltage pulses across the device, the motion of oxygen ions/vacancies and their pile-up at the perovskite oxide-electrode interface region is responsible for the EPIR effect. The changing concentration of vacancies within this interface region affects the conductivity of the perovskite oxide and results in resistance change. This change in concentration, however, results in a chemical potential gradient which under certain conditions can become a driver in changing the concentration of oxygen ions or vacancies between the interface region and the bulk, thus changing the resistance state of the device and yielding poor retention. What is needed is an EPIR device that is constructed to mitigate the retention challenge.

SUMMARY OF THE INVENTION

The retention challenge in resistance change devices can be mitigated by preventing the back motion of ions/vacancies after they have been moved by the application of an electric field. An electric-pulse-induced-resistance change device (EPIR device) is provided which is a resistance switching device. It has a buffer layer inserted between a first active resistance switching layer and a second active resistance switching layer, with both active switching layers connected to electrode layers directly or through additional buffer layers between the active resistance switching layers and the electrodes. This device in its simplest form has the structure: electrode-active layer-buffer layer-active layer-electrode.

The second active resistance switching layer may, in the alternative, be an ion donating layer, e.g., oxygen ion or metal ion, such that the structure becomes: electrode-active layer-buffer layer-ion donating layer-electrode.

In another embodiment of the invention, the device may have the structure: electrode-buffer layer-active layer-buffer layer-active layer-buffer layer-electrode, where additional buffer layers are introduced between the active layers and the electrodes. Any number and order of buffer layers may be incorporated into such buffer layer resistance switching devices, not limited to the examples shown here.

In these structures, the active resistance switching layers are preferably transition metal oxides. The buffer layers are preferably layers with low oxygen ion diffusion properties, but the layers may also be made of many other insulating materials, not limited to oxides such as metal nitrides.

In another embodiment of the invention, the active resistance switching layers are composed of compound materials within which specific ion species can migrate under the influence of an applied electric field, and the donor layers are composed of materials that donate the specific ions/vacancies to the active resistance switching layers. In this embodiment, the anti-diffusion layer to be interjected between the specific ion/vacancy donor layer and the active resistance switching layer can be composed of any combination of materials that can effectively reduce the migration of the specific ions/vacancies from the donor layer to the active resistance switching layer.

A method of using a two terminal multi-layer thin film resistance switching device is provided, which comprises: providing a two terminal multi-layer thin film resistance switching device comprising a first electrode, a second electrode, first and second active switching layers between the first and second electrodes, and a buffer layer between the first and second active switching layers; applying an electrical pulse between the first and second electrodes to create an electrical field or to inject an electrical current in the active resistance switching layers greater than a threshold electric field value that changes the resistance of the device; and using the thin film resistance switching device as a resistive random access memory device.

The applications of the EPIR device with a diffusion barrier include non-volatile memory devices, and electrically variable resistors in electronic circuits.

BRIEF DESCRIPTION OF THE DRAWINGS

FIGS. 1a and 1b are schematic plots of two switchable thin film devices that are two-terminal, buffered-EPIR devices: 1a) with one buffer layer; and 1b) with two buffer layers.

FIGS. 2a and 2b are graphs showing an example of the resistance change measurement of a PCMO ($Pr_{0.7}Ca_{0.3}MnO_3$) device without buffer layer in the test element.

FIGS. 5a and 5b are graphs showing (a) the resistance switch properties induced by electric pulses, and (b) the pulsed resistance hysteresis loop for a Sm—$CeO_2$/PCMO/YBCO/LAO buffered-EPIR sample.

DETAILED DESCRIPTION

Figure 3:
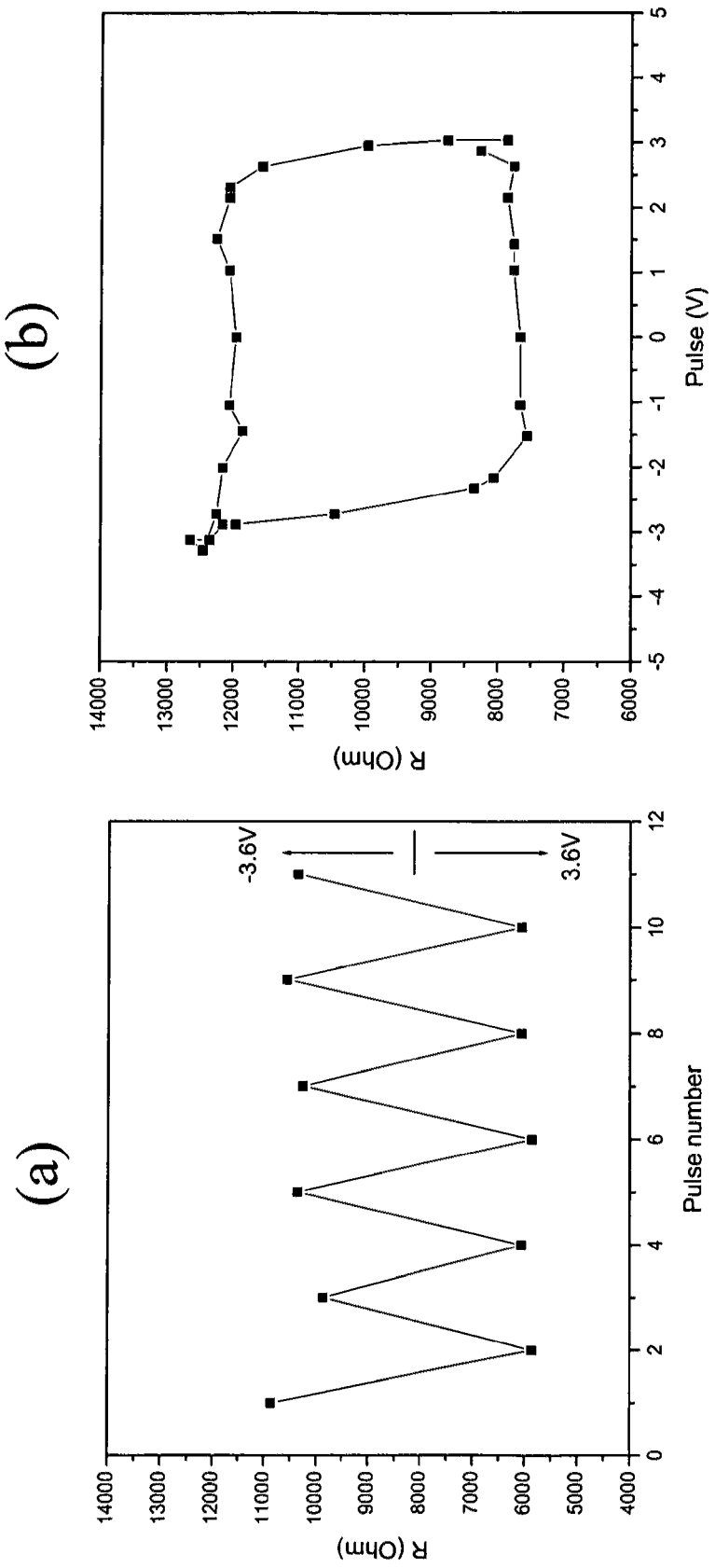
FIGS. 3a and 3b are graphs showing an example of the resistance change measurement of the PCMO device with a YSZ (Yttrium Stabilized Zirconia—$(ZrO_2)_{0.92}(Y_2O_3)_{0.08}$) buffer layer.

In summary, buffer layers are added to a resistance switching device to create a buffered resistance switching device. Referring to FIG. 1a, a bottom conductive electrode layer 12 is used as the bottom electrode layer on substrate 11. A thin top switchable function film, or layer, 14 partially covers the bottom conductive electrode layer 12. A bottom electrode contact pad 19 is connected to the bottom conductive electrode layer 12. The top switchable function layer 14 is covered with a top buffer layer 15. The top switchable function layer 14 and top buffer layer 15 form a multi-layer structure 50. A top electrode contact pad 16 is fabricated on top of the top buffer layer 15. Electrode contact pads 16 and 19 are connected to wires 17 and 18, respectively. The conductive electrode layer 12 and the top electrode contact pad 16 may be crystalline or polycrystalline conducting oxide or metallic layers.

Referring to FIG. 1b, the individual components and their arrangements in the buffered-EPIR device with two buffer layers are the same as in FIG. 1a, except that there is an additional thin bottom buffer layer 13. The thin bottom buffer layer 13, together with the switchable function layer 14 and the top buffer layer 15, form a multi-layer structure 60.

The buffered-EPIR device of FIG. 1a can also be an inverted structure where the buffer layer is deposited on the bottom electrode, and the top electrode contact is made to the switchable function layer. Multiple buffer layers can be substituted for any of the single buffer layers in FIGS. 1a and 1b. Multiple switchable function layers with or without buffer layers in between can be substituted for single layers in FIGS. 1a and 1b.

The preferred embodiment of the present invention consists of two conductive film layers as top-electrode and bottom electrode. Material of the conductive layer can be metal, alloy, conductive oxide, or other conductive materials, or their combination, as an example but not limited to Au, Ag, Cu, Al, Pt, $RuO_2$, $SrRuO_3$, $IrO_2$, $YBa_2Cu_3O7-x$ (YBCO), $La_{1-x}Sr_xCoO_3$ (LSCO), SiC, carbon-tube, or their combinations. The bottom conductive electrode layer 12 is deposited on an atomically ordered or polycrystalline substrate 11, e.g., $LaAlO_3$ (LAO), $SrTiO_3$ (STO), MgO, Si, GaAs, TiN, etc., with or without the pre-existence of circuits on the substrate. The bottom electrode contact pad 19 and top electrode contact pad 16 may be made of metal, conductive compounds and their combination, such as Ag, Au, Pt, Al, Cu, or other metal or alloy or a conducting oxide, and may be deposited by any variety of techniques onto the bottom conductive electrode layer 12 and top buffer layer 15, as well as the top switchable function layer 14, depending on device design.

The switchable function layer 14 is made of transition metal oxides, such as but not limited to $TiO_2$, NiO, $Cu_xO$, $ZrO_2$ $HfO_2$, $VO_2$ $PrCaMnO_3$, $LaCaMnO_3$, $(Ba_xSr_{1-x})TiO_2$.$Ag_2S$, $Cu_2S$, ZnS, CdS, GeSe, $CeO_2$, with a thickness in the range from about one nanometer to about several micrometers. For example, CMR materials including the manganese perovskites and the cobalt perovskites described as $ReBMnO_3$ and $ReBCoO_3$, where Re is rare-earth ions, B is alkaline ions, and their doped stoichiometric perovskites (such as $(La,Pr)(CaPb)MnO_3$) and non-stoichiometric perovskites (such as $LnBa(Co,M)_2O_{5+x}$, Ln=Eu or Gd, M=Cu, Fe) can be used as the active switchable layer in the buffered EPIR devices.

In the preferred embodiment, buffer layer 13, and/or buffer layer 15, is made of a diffusion barrier material consisting of single layer or multi-layer structure. Material for a buffer layer can be oxide or non-oxide with various lattice structures, including crystalline, polycrystalline, and glass. The oxide material for the buffer may be with or without perovskite lattice structure. Non-perovskite oxides, such as $SiO_2$, $CeO_2$, MgO, ZnO, $Y_2O_3$, and their doped oxides, such as yittrium-stabilized $ZrO_2$ (YSZ), (Sm,Gd) doped-$CeO_2$, are examples, but others may be suitable. When perovskite oxides are used as buffer layers, they can be switchable or non-switchable insulating materials. These switchable perovskite-related oxide buffer layers can be, but are not limited to, the high dielectric $ACu_3Ti_4O_{12}$ family, CMR materials and their non-doped parent Mott-insulator materials such as $LaMnO_3$, and polar materials such as $Ba_{1-x}Sr_xTiO_3$ (BST), $Pb(Zr,Ti)O_3$ (PZT), La doped-PZT (PLZT), and $Pb_3Ge_5O_{11}$ (PGO). Non-oxide materials such as nitrides can also be used for the buffer layers 13 and 15. The buffer layer thickness is preferably in the range from approximately 1 nm to about 500 nm.

By applying an electrical pulse between the top and bottom electrodes, 16 and 19, through wires 17 and 18, an electric field and current will be created across the multi-layer structure 50 or 60. A sufficiently high electric field strength and/or electric current density can change the charge distribution through ionic motion, and possibly the microstructures, and thus switch their states or modify properties such as the sensitivities to temperature, magnetic field, electric field, and mechanical pressure. Specifically, the reversible resistance switching change in the buffered-EPIR devices can be realized by applying short electric pulses to electrodes 16 and 19.

Because the materials for the top switchable function layer 14 have quasi-symmetric structure and electrical properties, the asymmetric interface properties between the bottom electrode 19 and the switchable function layer 14, and between the top electrode 16 and the switchable function layer 14, can be induced or enhanced by adding the buffer layers and the corresponding film deposition processing. The buffer layer may be used on the top side or bottom side or both sides of the switchable function layer, shown as FIG. 1a-b. In the present invention, the buffered interface is defined as the boundary of conductive electrode(s) and resistance switchable film, which includes the thin buffer layer and the adjacent surface regions of both the electrode layer and switchable function layer in the buffered-EPIR devices. The thin buffer layers, interposed between the switchable function layer 14 and the electrodes 16 and 19, can be used to modulate the barrier height, the density of electric carriers, carrier mobility, and/or carrier distribution in the interface area. The buffer layers can also be selected to change carrier spin distribution and spin-alignment state in the interface region. The buffer layers can be selected to change the chemical distribution and lattice structure at the interface as well as to modify electrical characteristics of the interface such as filament conduction. The buffer layers can be selected to compensate temperature dependence of device resistance switching performance, and to enhance device radiation hardness. For instance, the additional interface asymmetry induced by the buffer layers can enhance the reversible resistance switching properties of the buffered-EPIR device (resistor) from high-resistance state ($R_H$) to low resistance state ($R_L$) by voltage and current of short electric pulses, and to stabilize the properties of resistive switching and its non-volatility. Further, adding the buffer layers can be used to protect the device from being damaged or degraded by too large of energy shock by applied electric pulses, and to modify the non-volatile hysteresis loops to introduce more resistance states for multi-level memory application of the device.

The buffer layers can be made by various deposition techniques including rf-sputtering, e-beam evaporation, thermal evaporation, metal organic deposition, sol gel deposition, pulse laser deposition, and metal organic chemical vapor deposition, but not limited only to these techniques.

The following are examples to illustrate the need for the buffer layers in buffered-EPIR device of the present invention. FIG. 2 shows the resistance change of a device without a buffer layer (in an EPIR device), using a perovskite oxide material with composition of $Pr_{0.7}Ca_{0.3}MnO_3$ (PCMO) as the switchable active material. The PCMO film of 600 nm thickness was deposited on top of a YBCO bottom electrode layer of about 500 nm on a $LaAlO_3$ (100) substrate by pulse laser deposition (PLD) method. The switching resistance change after 100 ns single pulses were applied to the device is shown in FIG. 2a. The low resistance value, $R_L$ of ~250Ω, was obtained after a +13V pulse was applied, and the high resistance value, $R_H$ of ~400Ω, was obtained after a −13V pulse was applied. The resistance of the sample is measured with very small sensing current of ~1 μA, which does not switch the resistance of sample. The positive pulse direction is defined as from the top electrode to the bottom electrode. The switch ratio $(R_H-R_L)/R_L$ in this sample is ~60%. FIG. 2b is R vs. pulse-voltage hysteresis loop for the device measured after each pulse was applied. The resistance change after 5V-pulse is smaller than 10%. Device resistance R reaches the low state after pulses of ≥+12V are applied. It then stays at the low state when lower voltage positive and small voltage negative pulses are applied. R starts to increase after negative voltage pulses with amplitude larger than 10V are applied, and goes to the high state with pulse about −13V. The low state and high state shown in the hysteresis loop measurement are not exactly the same as $R_L$ and $R_H$ obtained in FIG. 2a, because during the hysteresis measurement, multiple-pulses are in effect applied instead of the single switch pulses used in FIG. 2a.

FIG. 3 shows the resistance change versus electrical pulse number for the device of the present invention, a buffered-EPIR device, that is, a PCMO device with a yttria stabilized zirconia ("YSZ") buffer layer between top-electrode and the PCMO layer. The thin YSZ buffer layer was deposited by PLD on the PCMO/YBCO/LAO, which was fabricated under the same growth conditions as the sample used in FIG. 2. FIG. 3a shows the device resistance switching under single pulses. The device resistance increases significantly after adding the insulating YSZ buffer layer. However, the voltage needed for switching the device is reduced to ~±3V in comparison with the ±13V for the non buffered EPIR sample in FIG. 2, and the switch ratio of the buffered-EPIR sample has increased to ~70% as shown in FIG. 3a. This shows that lower operation voltage and higher resistance switching ratio are obtained for the buffered-EPIR device as compared to the non-buffered EPIR device. FIG. 3b is the non-volatile resistance hysteresis measurement, which shows the device switches under ±3V pulses. It also shows that a rapid transition to switching into the low or to high R states can be achieved by the buffered-EPIR system due to the nearly rectangular hysteresis loop. Again, the high R and low R states obtained in FIG. 3b are not the same as in FIG. 3a because of the multiple pulses applied in the measurement.

Figure 4:
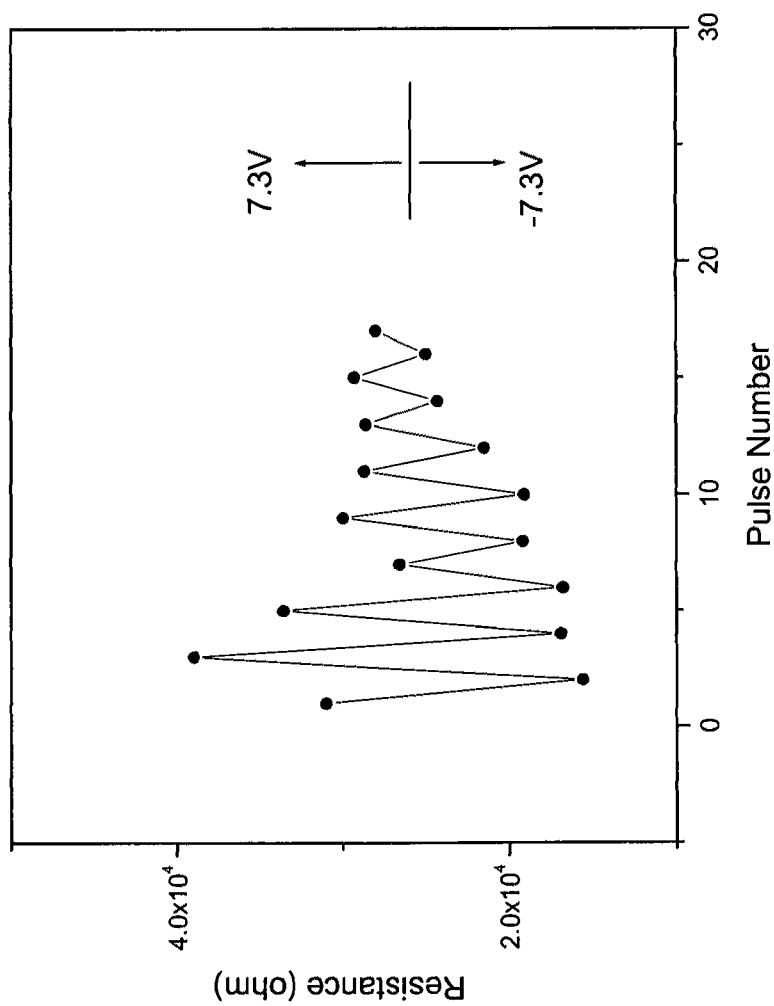
FIG. 4 is a graph showing resistance change measurement of a YSZ buffer layer alone, i.e., without the underlying PCMO perovskite switchable function layer.

Referring now to FIG. 4, the resistance switching properties of a YSZ buffer film without a PCMO active layer in an electrode/YSZ/electrode structure was also studied in order to identify if the resistance switching behavior observed in the buffered-EPIR device was due only to the resistance switching of the YSZ buffer layer. In this test the YSZ film was grown on YBCO/LAO substrate under the same conditions as the sample of FIG. 3 (where the YSZ film was used as a buffer layer and was deposited on PCMO on the YBCO/LAO substrate). The resistance of the YSZ film on YBCO could be switched, but the switch ratio quickly decayed, as shown in FIG. 4. In addition, the YSZ/YBCO sample required a much higher switching pulse voltage of ±7.3V as compared to the ~±3V switch voltage needed for the YSZ/PCMO/YBCO sample shown in FIG. 3. This indicates that the PCMO layer is the major active switching layer in the YSZ buffered-EPIR device, and that the buffer layer does improve switching properties of the buffered-EPIR device.

As another example, non-perovskite insulating $CeO_2$ and Sm-doped $CeO_2$ materials were used as buffer layers. FIG. 5 shows switching in the resistance versus electrical pulse number curve for a PCMO device with a Sm-doped $CeO_2$ buffer layer inserted between an Au top electrode and the PCMO switch layer in the buffered-EPIR device. Multiple pulses were applied under plus and minus pulse polarity, with the device resistance changing by more than a factor of 4 under applied pulse voltage as low as ±2.7V. Such low switching voltage will allow the resistive device to be easily incorporated into semiconductor circuits.

Figure 6A:
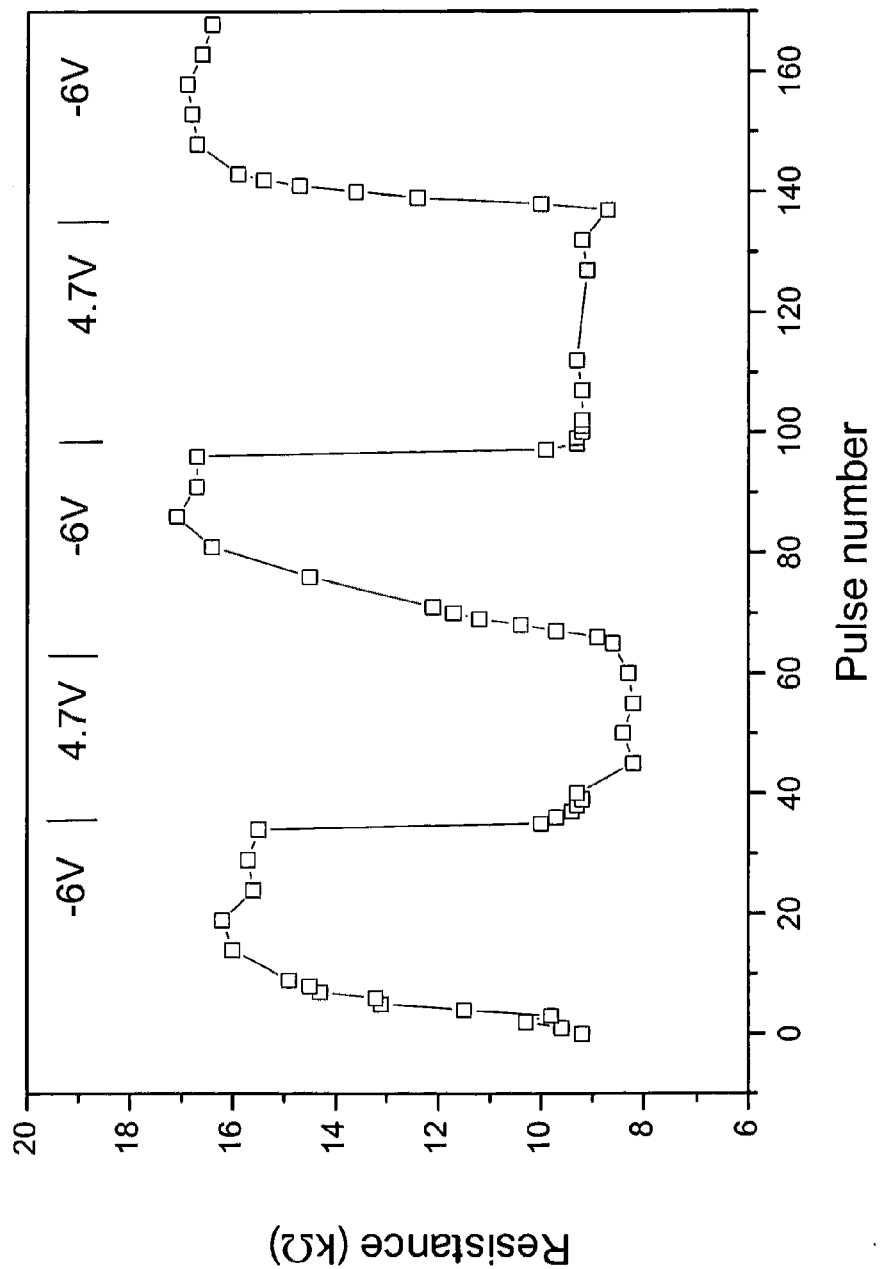
FIGS. 6a and 6b are graphs showing (a) resistance versus electric pulses, and (b) the pulsed resistance hysteresis loop for a PLZT/PCMO/YBCO/LAO buffered-EPIR memory sample.
Figure 6B:
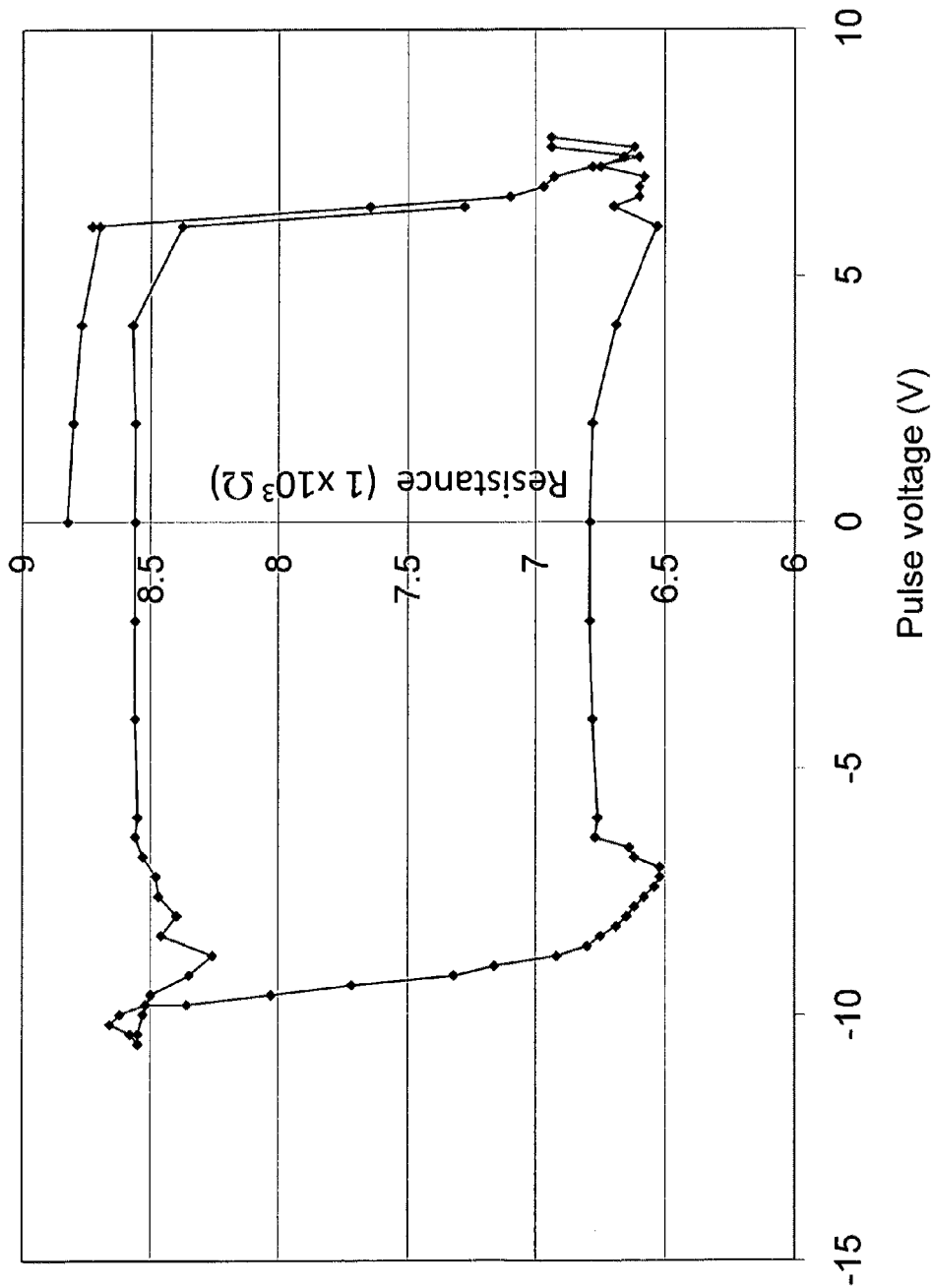

As another example, CCTO, PLZT, BST and PGO switchable materials can also be used as the buffer layer in the present invention. The switchable perovskite material can be polar, such as PZT or PLZT, or non-polar material, such as CCTO. A buffered-EPIR device with a buffer PLZT layer inserted between the Ag top electrode and the PCMO layer was switched to the low $R_L$ state (~9 k$\Omega$) by 4.7V pulses, and to the high $R_H$ state (~16 k$\Omega$) by −6V pulses, as shown in FIG. 6, yielding a switch ratio of ~80%. Although PLZT is a ferroelectric material, the buffered-EPIR device of the present invention is different from existing ferroelectric switching devices. In the existing ferroelectric devices, the non-volatile switching property is based on the two polarization states, or on dipole moment switching of the ferroelectric layer in the ferroelectric capacitor and requires the measure of charge flow into the ferroelectric in order to switch the polarization state. The ferroelectric buffer material used in the buffered-EPIR device of the present invention relies on both the insulating and ferroelectric polarization field properties to enhance device retention. The polarization field of the ferroelectric layer provides a bias that essentially restricts ion/vacancy motion in the active function layer of the device.

In the previous examples, the non-volatile resistance switching properties of the buffered-EPIR device were obtained by applying across the device, positive and negative pulses alternatively, that is, bi-polar electric pulses. For some applications, it may be more convenient to switch the device resistance, i.e., increase or decrease resistance by single polarity pulses—only positive pulses or only negative pulses, uni-polar electric pulses with different durations, or with different intensities, or with different applied pulse numbers, or their combination.

Figure 7:
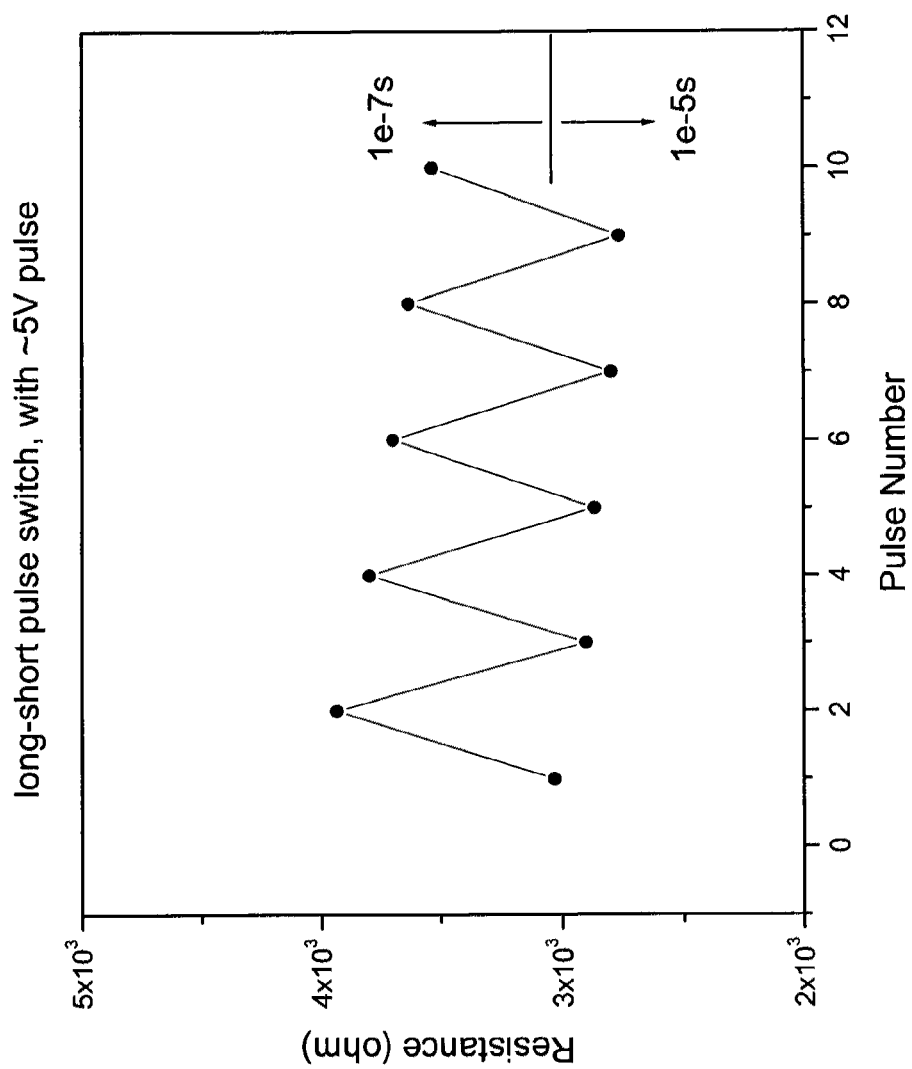
FIG. 7 is a graph showing resistance versus electric pulse number for a YSZ/PCMO/YBCO/LAO memory sample, where the electrical poling pulses have the same polarity (field from top electrode to low electrode).
Figure 8:
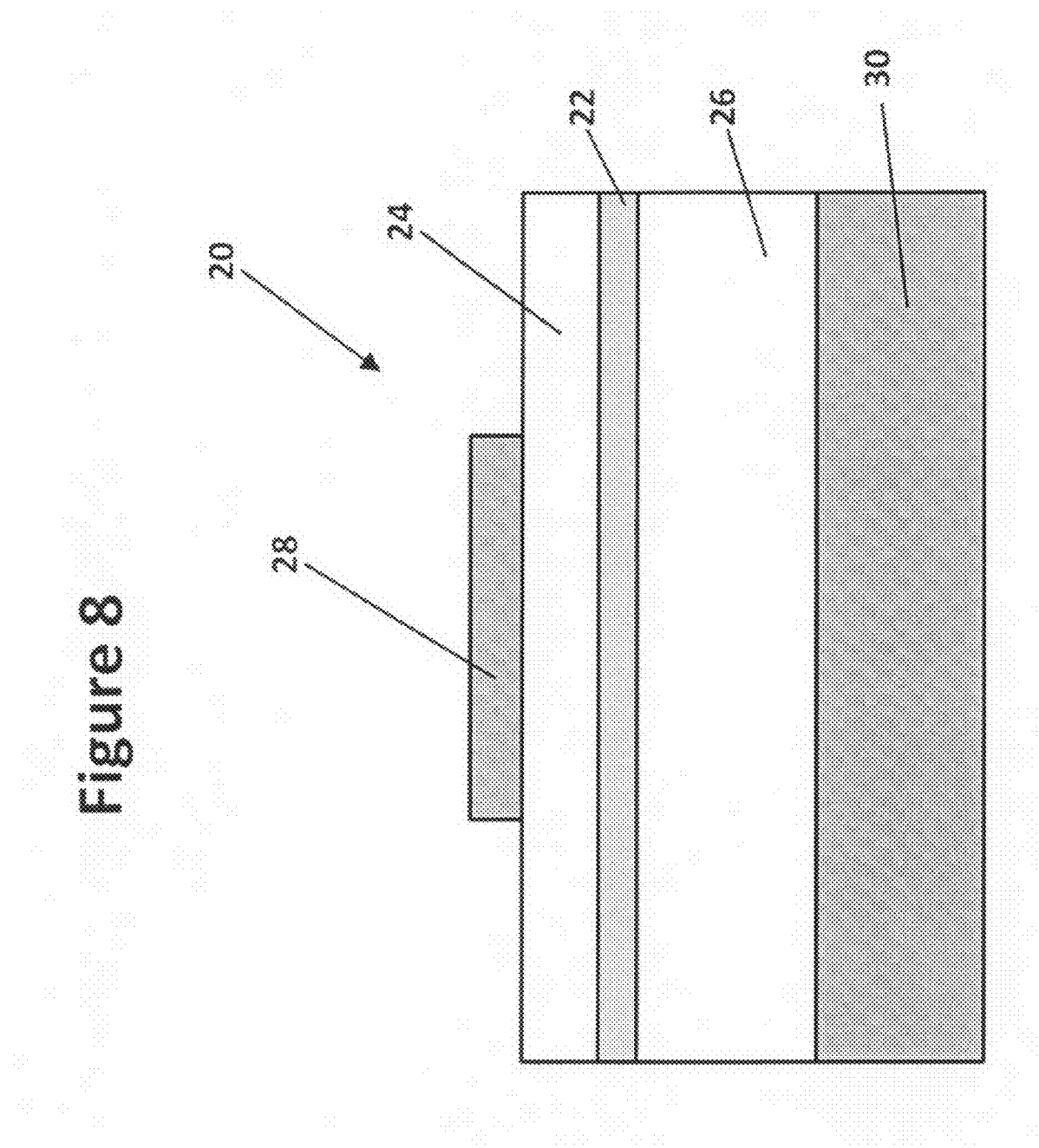
FIG. 8 is a schematic of the resistance switching device with a diffusion barrier layer showing a structure of electrode-active layer-buffer layer-active layer-electrode.

Referring now to FIG. 7, the non-volatile resistance of a YSZ/PCMO/YBCO/LAO sample was switched by applying uni-polar electric pulses. After initial set up the device was switched to the high resistance state of $R_H$=~3.7 Kohm by application of a +5V, 100 ns positive pulse, and switched to a low resistance state of $R_L$=~2.9 Kohm by application of a +5V, 10 microsecond positive pulse. Similar reversible resistance switching behavior may be achieved not only by both positive pulses, but also by both negative pulses.

The buffer/switchable-layer structure offers great opportunity to modify the layer interface properties, and to modify the character of the hysteresis loop (the definition of the hysteresis has been explained in FIG. 2b and FIG. 3b) of the buffered-EPIR device. These modifications can result in increased flexibility for applications of the reversible non-volatile resistor. One example is to modify the slope of the transition edge of the hysteresis loop. Sharpening the slope will benefit binary-state applications of the switchable resistor, while flattening the slope of the hysteresis curve will offer more multi-valued resistance states.

Instead of the heterojunction buffer/switchable-function-layer/electrode described in FIG. 1, it is also possible to use in the buffered-EPIR device a switchable perovskite multi-layer materials system with homojunction or gradient configurations, or their combination. The homojunction or gradient materials can be fabricated by controlling doping of the layer materials and/or controlling the film deposition processing. For example, a device can have a top-electrode/YSZ/PCMO structure, and use a graded PCMO film as the bottom electrode, if the lower part of the PCMO layer is doped to be conductive. As another example, a homojunction or gradient PCMO layer can even function as a complete buffer/PCMO/electrode component of a buffered-EPIR device. As a result, the device can be further simplified to be a top-electrode/homojunction or gradient PCMO layer directly on a substrate.

In another preferred embodiment of the present invention, the EPIR device 20 includes a buffer layer which acts as a diffusion barrier layer 22 which is inserted between a first active resistance switching layer 24 and a second active resistance switching layer 26 with both switching layers connected to electrode layers 28, 30 directly or through additional buffer layers between the active resistance switching layers 24, 26 and the electrodes 28, 30. This device in its simplest form has a structure: electrode-active layer-buffer layer-active layer-electrode.

In one preferred embodiment, the second active resistance switching layer 26 may be an ion donating layer such that the simplest structure now becomes: electrode-active layer-buffer layer-ion donating layer-electrode.

In a more complex alternative structure, the device 20 would have the following structure: electrode-buffer layer-active layer-buffer layer-active layer-buffer layer-electrode, where additional buffer layers (not shown) are introduced between the active layers 24, 26 and the electrodes 28, 30. Any number and order of buffer layers could be incorporated into such buffer layer resistance switching devices 20, not limited to the examples shown here.

In these structures, the active resistance switching layers 24, 26 are transition metal oxides or solid state electrolytes. The oxides can be either complex oxides such as perovskites, including $PrCaMnO_3$, or simple binary oxides, such as HfO, or a combination of both in the case where two or more active function layers are used in a device. The solid state electrolytes include materials such as GeS, GeSe, and $Cu_2S$. The buffer layers are typically layers with low oxygen ion diffusion, such as $Al_2O_3$, $ZrO_2$, or $Y_2O_3$, or many other antidiffusion layers not limited to oxides such as metal nitrides, e.g. BN, TiN, or SiC.

As an example, the oxygen donating layer 26 can be an oxygen ion donating oxide which has a moderately high mobility of oxygen ions and can serve as an oxygen ion source. The oxygen donating layer 26 can also be an oxide which changes stoichiometry under the application of an electric field, i.e., loses oxygen ions through field-induced migration, thus rendering it an oxygen ion donor, such as but not limited to $PrCaMnO_3$ or $LaCaMnO_3$.

In another embodiment, the active resistance switching layers 24 are composed of compound materials such as GeSe, $Ag_2Se$ or $Cu_xS$ within which specific ion species can migrate under the influence of an applied electric field, and the donor layer (s) 26 are composed of materials that are similar or equivalent to the active resistance switching materials or may contain migrating species related to the active resistance switching material such as AgGeSe which can donate the specific ions/vacancies (such as Ag) to an active resistance switching layer such as $Ag_2Se$. In this embodiment, the antidiffusion layer 22 to be interjected between the specific ion/vacancy donor layer 26 and the active resistance switching layer 24 can be composed of any materials combination that can effectively reduce the migration of the specific ions/vacancies from the donor layer 26 to the active resistance switching layer 24. As an example, an $Al_2O_3$ anti-diffusion layer for a $PrCaMnO_3$ active resistance switching layer may be used.

The characteristics of the integrated buffer layer 22 are, among other things, the increase of retention of resistance switching devices by the reduction in diffusion of mobile species between active regions 24, 26 of the device 20. An example of improvement of retention of such a resistance switching device 20 based on PCMO with an added Al$_2$O$_3$ anti-diffusion layer 22 between the bulk PCMO regions (donor region) 26 and the top PCMO active resistance switching layer 24 is shown in FIGS. 9a and 9b.

Figure 9:
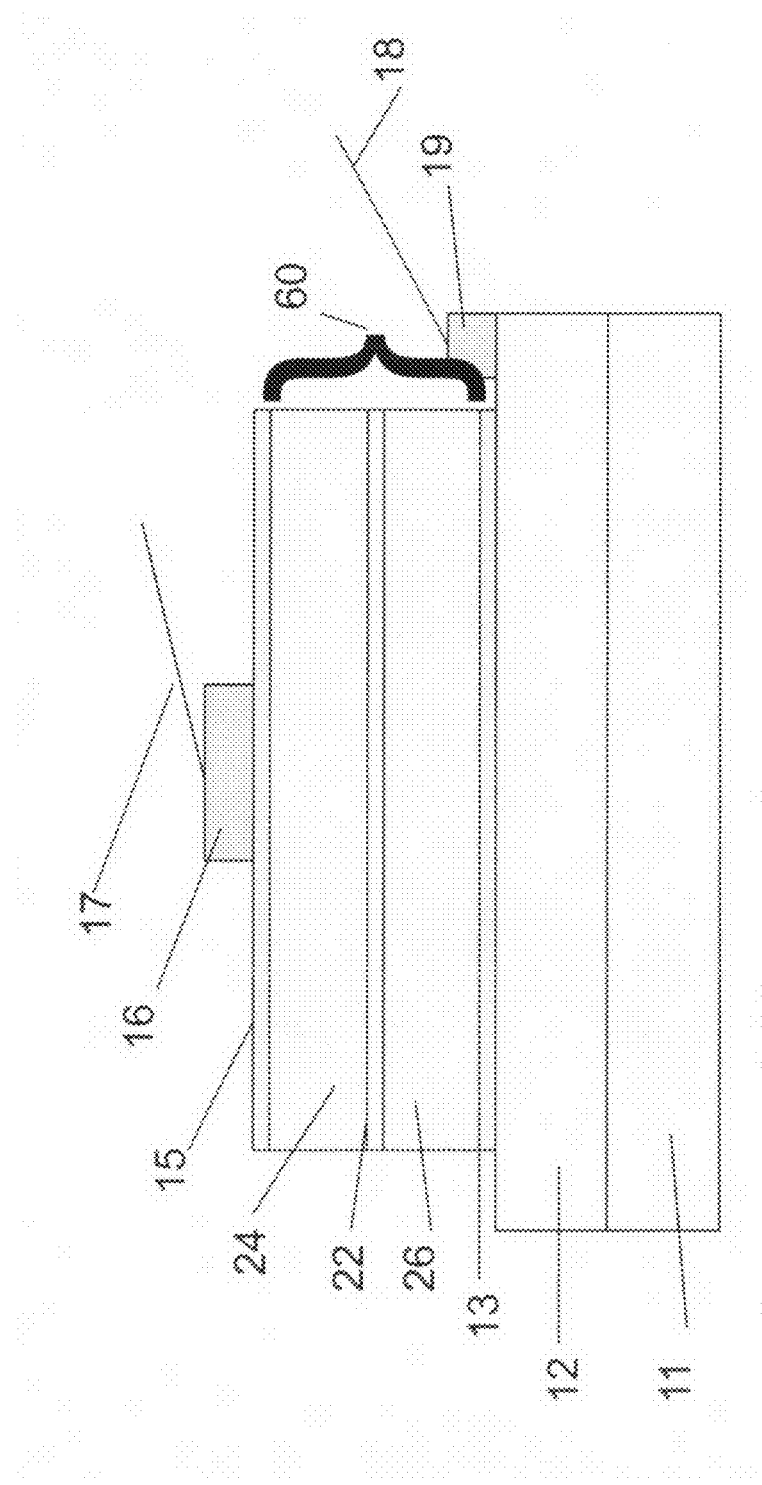
FIG. 9 is a schematic of the resistance switching device with a diffusion barrier layer between the two active resistance switching layers and additional buffer layers between the active layers and the electrodes showing a structure of electrode-buffer layer-active layer-buffer layer-active layer-buffer layer-electrode.
Figure 10A:
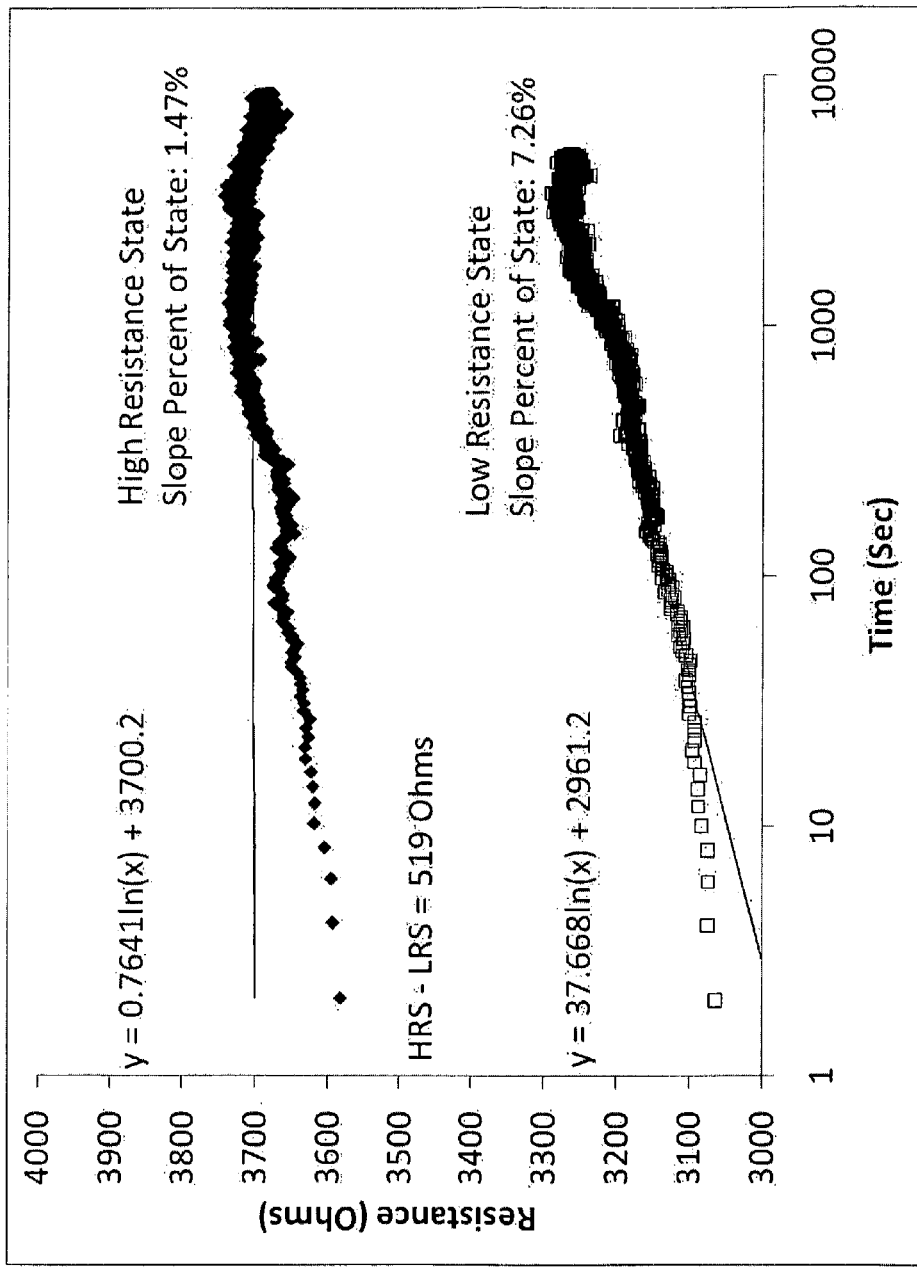
FIG. 10a is a graph showing retention of a PCMO resistance switching device with no incorporated anti-diffusion layer.
Figure 10B:
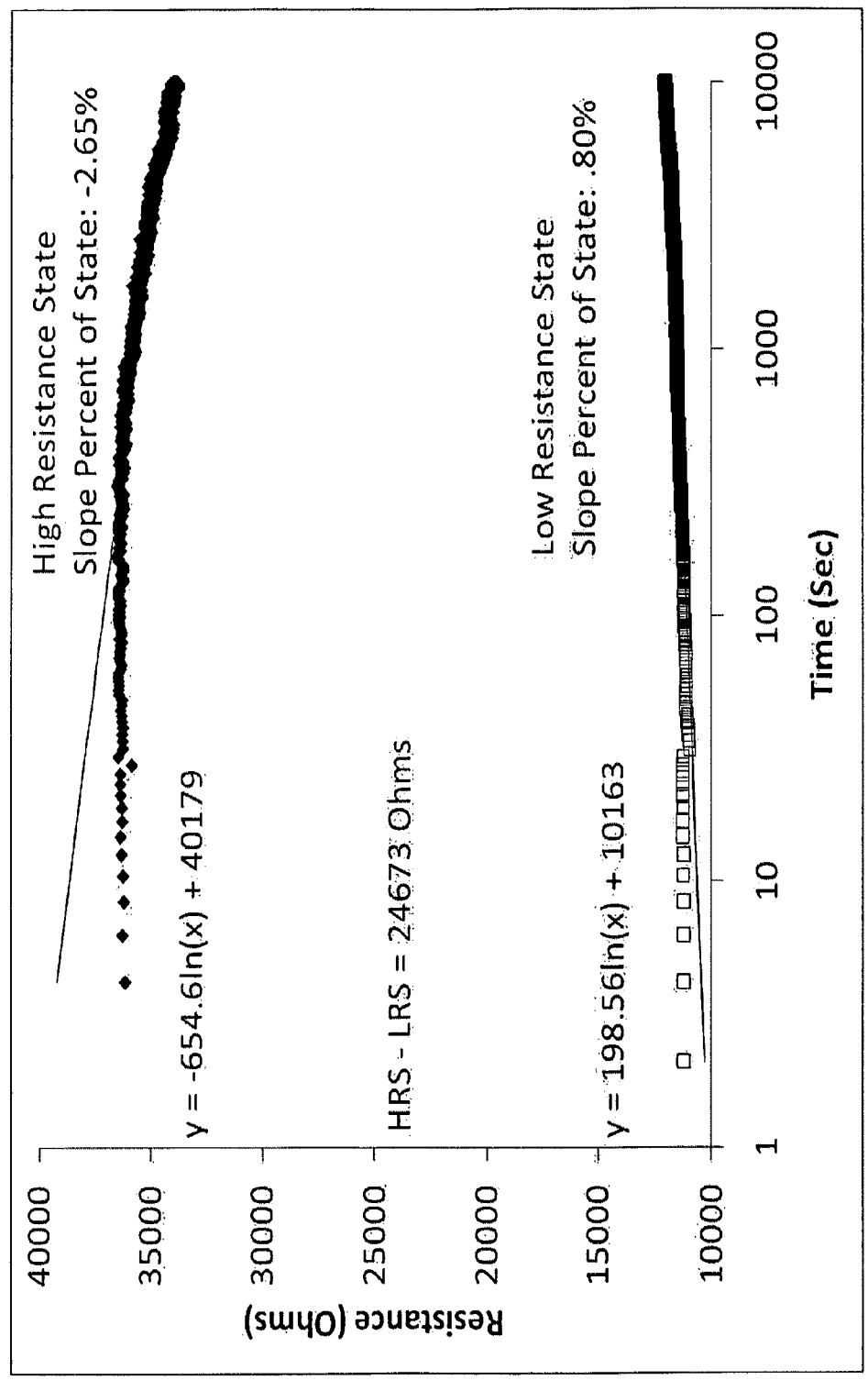
FIG. 10b is a graph showing retention of a PCMO resistance switching device with an integrated $Al_2O_3$ anti-diffusion layer.

FIG. 9a shows that the both the high resistance state (HRS) and the low resistance state (LRS) significantly change as a function of time exhibiting a 1.47% and 7.26% increase in resistance per decade of time. This would yield a net 10 year change of nearly 12% for the HRS and 58% for the LRS, bringing the final EPIR ratio to only 13%, which may be too low of a ratio and unacceptable for these non-volatile memory device applications.

FIG. 9b shows that upon incorporating a 7 nm thick Al$_2$O$_3$ anti-diffusion layer 22 between the bulk PCMO and a 50 nm top PCMO layer, the retention significantly improved, such that the HRS showed a −2.65% change per decade, and the LRS showed a 0.8% change per decade, resulting in a final 10 year EPIR ratio of 226%, as compared to the initial ratio of 263%, which is fully acceptable for non-volatile memory devices.

The preferred method of the invention comprises providing a two terminal multi-layer thin film resistance switching device 20, with a first electrode 28, a second electrode 30, first and second active switching layers 24, 26 between the first and second electrodes 28, 30, and a buffer layer 22 between the first and second active switching layers 24, 26; applying an electrical pulse between the first and second electrodes 28, 30 to create an electrical field or to inject an electrical current in the active resistance switching layers greater than a threshold electric field value or threshold electric current value resulting in a change in resistance of the device; and using the thin film resistance switching device 20 as a resistive random access memory device; i.e., a device that has two or more resistance states yielding at least "0"-"1" logic for a memory device.

This invention significantly improves the retention performance of resistance switching devices based on the field induced migration of specific ions/vacancies, and now allows for the effective use of these devices in resistance memory applications. The device can be used to make random access or read only memory devices with high data density and high read/write speed. Another application of this properties-modification method yielding the buffered-EPIR device is for a variable resistor that can be used in electronic circuits. Another application of this method is to modify the characteristics of the device, to increase or decrease their detection sensitivities when they are used as sensors for temperature, magnetic field, electric field, and mechanical pressure.

Although the above device and method are described in terms of the above preferred embodiments, those skilled in the art will recognize that changes in the method and device may be made without departing from the spirit of the invention. Such changes are intended to fall within the scope of the following claims.

We claim:

1. A two terminal multi-layer thin film resistance switching device comprising:
   a first electrode;
   a second electrode;
   first and second active switching layers between the first and second electrodes; and
   a buffer layer between the first and second active switching layers.

2. The device of claim 1, wherein the second active switching layer is an oxygen ion donating layer.

3. The device of claim 1, wherein there are at least two buffer layers between the active switching layers.

4. The device of claim 1, wherein the active switching layers are transition metal oxides.

5. The device of claim 1, wherein the second active switching layer is an ion donating layer.

6. The device of claim 2, wherein the first active switching layer is comprised of a compound material that that permits specific ion species to migrate under the influence of an applied electric field and the ion donating layer is comprised of a material that donates specific ions to the active switching layer.

7. The device of claim 6, wherein the buffer layer between the first and second active switching layers is comprised of a combination of materials that reduces the migration of specific ions from the ion donating layer to the first active switching layer.

* * * * *